United States Patent
Barkarö et al.

(10) Patent No.: US 7,801,296 B2
(45) Date of Patent: Sep. 21, 2010

(54) XDSL-LINE-INTERFACE-CIRCUIT

(75) Inventors: Karl Stefan Barkarö, Åkersberga (SE);
Bo Bokinge, Bromma (SE); Jörg Hauptmann, Wernberg (AT);
Karl-Mikael Johanson, Stockholm (SE); Lars Karlsson, Täby (SE);
Torbjörn Ivar Randahl, Nacka (SE)

(73) Assignee: Infineon Technologies AG, Munich (DE)

( * ) Notice: Subject to any disclaimer, the term of this patent is extended or adjusted under 35 U.S.C. 154(b) by 1618 days.

(21) Appl. No.: 11/044,644

(22) Filed: Jan. 27, 2005

(65) Prior Publication Data

US 2005/0213646 A1    Sep. 29, 2005

(30) Foreign Application Priority Data

Jan. 27, 2004    (EP)  .................................. 04001712

(51) Int. Cl.
*H04M 1/00*    (2006.01)
*H04M 9/00*    (2006.01)

(52) U.S. Cl. ...................................................... 379/395
(58) Field of Classification Search .................. 379/395
See application file for complete search history.

(56) References Cited

U.S. PATENT DOCUMENTS

| 6,107,875 A | 8/2000 | Pullen et al. |
| 6,861,902 B2* | 3/2005 | Piessens et al. ............. 330/109 |
| 6,933,752 B2* | 8/2005 | Dreps et al. ..................... 327/65 |

FOREIGN PATENT DOCUMENTS

EP    1 229 641 A1    8/2002

\* cited by examiner

*Primary Examiner*—Alexander Jamal
(74) *Attorney, Agent, or Firm*—Maginot Moore & Beck

(57) ABSTRACT at least one self oscillating loop circuit which oscillates with a switching frequency ($f_s$), wherein the self oscillating loop circuit (18, 19, 20) comprises an output driver (19) which is switched with said switching frequency and a loop filter (20) which feeds back an amplified loop signal output by said driver (19) to an input of said self oscillating loop and a trimming circuit (21) for trimming the switching frequency (fs) of said self oscillating loop circuit.

23 Claims, 7 Drawing Sheets

FIG 1
Prior Art switched mode line driver

XDSL-LINE-INTERFACE-CIRCUIT

FIELD OF THE INVENTION

The invention relates to an xDSL-Line-Interface-Circuit comprising a self-oscillating loop circuit.

BACKGROUND

A usual subscriber line technology (DSL) offers fast data transfer on existing copper-based telephone lines. In DSL, broad-band data signals are transmitted on significantly higher frequencies than traditional narrow-band telephone signals. Since the narrow-band telephone signals and the broad-band data signals are both transmitted over the same subscriber line, splitter devices are provided for splitting and recombining the two types of signals at both ends of the subscriber line, i.e. at the central office or switching center, and at the end terminals at the subscriber location. There are various types of DSLs that have evolved over the last years such as ADSL, HDSL, MDSL, SDSL and VDSL. Multitone modulation is the basis of the DMT version of ADSL as well as some multi-carrier versions of VDSL. This type of modulation is also called orthogonal frequency division multiplexing (OFDM). In discrete multitone modulation (DMT), a given frequency range for data transmission is resolved into a number of narrow frequency bands for use as individual data links. In ADSL, data transmission occurs roughly between 20 kHz and 0.1 MHz.

In order to transmit the xDSL data signals over the telephone line which consists of a pair of copper wires, the central office must be provided with line drivers. The line driver compensates for the attenuation of the telephone line and has to comply with the PSD mask requirement of the DSL standard. The line driver amplifies the line-coded xDSL signal so that it is received downstream at the subscriber location with sufficient signal intensity. Similarly, the line drivers are provided at the subscriber locations for transmitting xDSL data upstream to the central office.

The basic component of each line driver is a power amplifier for amplifying the xDSL signal which is to be transmitted over the telephone line.

Conventional line drivers include linear class-B and AB amplifiers. However, the driving transistors in a class-AB amplifier are biased to operate in their linear region so that they are always in an on-state and draw quiescent current. This results in an inefficient power dissipation.

Accordingly, it has been proposed to employ class-D amplifiers in xDSL line drivers to improve the power efficiency. The class-D amplifier according to the state of the art comprises a self-oscillating loop for generating a switching frequency and a preamplifier which receives an input signal from a signal source. The self-oscillating loop contains a comparator that converts the analog input signal to a digital output signal. The preamplifier and the comparator create a variable duty cycle square wave signal. As a consequence, a pulse train is created wherein the duty cycle is proportional to the level of the input signal. This pulse width modulated signal is coupled to the gates of two complementary output transistors. The source drain paths of the two copper transistors are connected in series between a supply voltage VDD and ground GND. In effect, the pulse width modulated signal with a duty cycle proportional to the input signal level turns complementary output transistors on and off with a switching frequency which is much greater than the frequency of the input signal. Hence, power is sufficiently delivered from the power supply to the load.

Line drivers employing class-D power amplifiers achieve a higher power efficiency than conventional line drivers. The so-called switched mode line drivers are based upon a self-oscillating circuit core.

Figure 1:
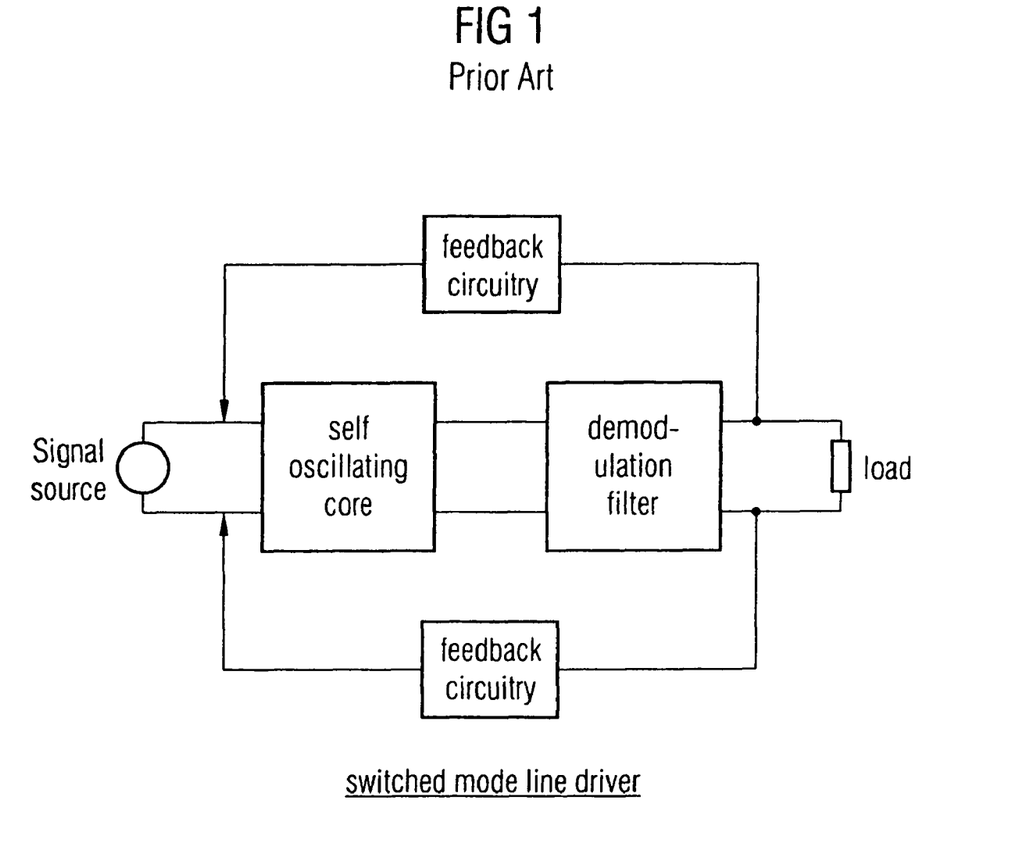
FIG. 1 shows a switched mode line driver according to the state of the art.

FIG. 1 shows a block diagram of a conventional broad-band line driver having a self-oscillating core. The self-oscillating core oscillates at a switching frequency of e.g. 10 MHz. The self-oscillating core switches the output stage with a switching frequency. A demodulation filter is provided at the output of the self-oscillating core for removing switching residuals from the output signal spectrum. Analog feedback is supplied outside the demodulation filter and fed back to the input of the self-oscillating core in order to define the gain of the amplifier and to adapt the termination impedance to the output of said line driver. At the input terminals of the self-oscillating core, the input signal generated by a signal source is superimposed on the feedback signals.

Figure 2:
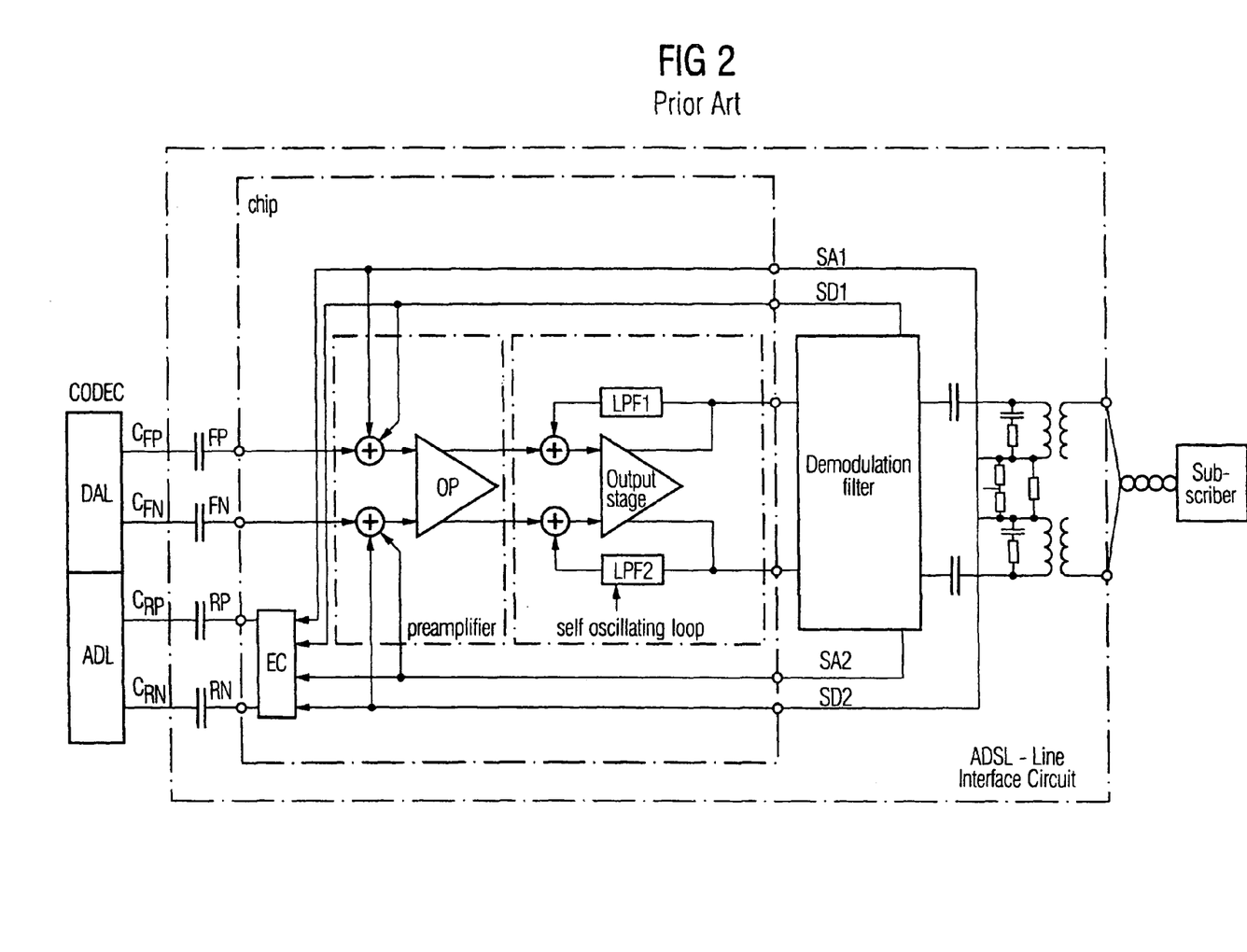
FIG. 2 shows an ADSL-line-interface-circuit according to the state of the art.

The analog line driver as shown in FIG. 2 according to the state of the art receives analog signals and outputs analog signals. However, the analog driver is built around a switched core where the switching frequency is dependent on the stability properties of the internal switched loop.

FIG. 2 shows a switched mode line driver such as in FIG. 1 in more detail. FIG. 2 shows an ADSL-line-interface-circuit connected to a CODEC circuit. The ADSL-line-interface-circuit can be used in the central office, DSLAM, DLC and MSAP applications. The ADSL interface circuit receives an analog input signal from a digital analog converter DAC of the CODEC via capacitors. The transmit input interface is a differential voltage interface. The ADSL-line-interface-circuit is connected to the output of the DAC via AC-coupling capacitors.

The ADSL-line-interface-circuit comprises one self-oscillating loop circuit. The oscillating loop circuit includes a switched output driver which switches with a switching frequency $f_s$ of the oscillating loop circuit. The input of the switched output driver contains a comparator that converts the analog input signal to a digital signal. The output of the switching output driver is fed back via a low-pass filter LPF1, LPF2 to adders which are connected to the inputs of the switched output driver. The output of switching output driver is connected to a demodulation filter. The output of the demodulation filter is fed back to the input of the oscillating core and applied to an analog adaption circuit for adapting the output impedance of the ADSL-line-interface-circuit to the impedance of the subscriber line.

The ADSL-line-interface-circuit comprises one self-oscillating loop circuit wherein the self-oscillating loop circuit has a loop signal which oscillates with a switching frequency $f_s$. Both low-pass filters LPF are analog RC low-pass filters. The switching frequency $f_s$ of the oscillating loop circuit depends on the capacitance of the capacitors provided in both low-pass filters LPF1, LPF2.

The drawback of the ADSL-line-interface-circuit as shown in FIG. 2 is that the capacitance of the capacitors of the RC-low-pass filters LPF1, LPF2 is not adjustable. The switching frequency $f_s$ of the oscillating loop circuit depends on the capacitance of the low-pass filters. With increasing switching frequency $f_s$, the current consumption of the ADSL-line-interface-circuit is increased. After production of the integrated ADSL-line-interface-circuit, the capacitance provided in the low-pass filters LPF1, LPF2 vary within certain limits so that the switching frequency $f_s$ of the self-oscillating loops is in many cases too high. As a consequence, the current consumption of the ADSL-line-interface-circuit according to the state of the art as shown in FIG. 2 varies in a broad range and is often too high.

SUMMARY

Accordingly, it is the object of the present invention to provide an xDSL-Line-Interface-Circuit with a self-oscillating loop circuit wherein the switching frequency $f_s$ is adjustable so that the current consumption and performance of the xDSL-Line-Interface Circuit is optimized.

This object is achieved by an xDSL-Line-Interface-Circuit having the features of embodiments of the invention.

The invention provides an xDSL-Line-Interface-Circuit having at least one self-oscillating loop circuit which oscillates with a switching frequency, wherein the self-oscillating loop circuit comprises a switched output driver which is switched with said switching frequency and a loop filter which feeds back an amplified loop signal output by said switched driver to an input of said self oscillating loop circuit, and a trimming circuit for trimming the switching frequency of said self-oscillating loop circuit.

In a preferred embodiment, the loop filter is an analog low-pass filter.

In a preferred embodiment of the xDSL-Line-Interface-Circuit according to the present invention, the analog low-pass filter is an RC-filter comprising at least one capacitor having an adjustable capacitance.

In a further embodiment of the xDSL-Line-Interface-Circuit according to the present invention, the capacitance of the capacitor is adjusted by the trimming circuit via control lines.

In a preferred embodiment of the xDSL-Line-Interface-Circuit according to the present invention, the switched driver is a class-D amplifier.

In a further embodiment of the xDSL-Line-Interface-Circuit according to the present invention, the trimming circuit is connected to said self-oscillating loop circuit for receiving the loop signal oscillating with said switching frequency.

In a preferred embodiment, the xDSL-Line-Interface-Circuit is an ADSL-line-interface-circuit.

In a further preferred embodiment of the xDSL-Line-Interface-Circuit according to the present invention, the trimming circuit performs the trimming of the switching frequency during a training sequence of the xDSL-Line-Interface-Circuit.

In a preferred embodiment of the xDSL-Line-Interface-Circuit according to the present invention, the trimming circuit comprises a control counter which counts the pulses of a reference clock signal.

In a preferred embodiment of the xDSL-Line-Interface-Circuit according to the present invention, the trimming circuit further comprises a switching frequency counter which counts the pulses of the loop signal.

In a preferred embodiment of the xDSL-Line-Interface-Circuit according to the present invention, the trimming circuit further comprises a first digital comparator which compares the count value of said switching frequency counter with a fixed first set count value.

In a further embodiment of the xDSL-Line-Interface-Circuit according to the present invention, said switching frequency counter is connected to said control counter for receiving a reset signal.

In a further embodiment of the xDSL-Line-Interface-Circuit according to the present invention, the first digital comparator is connected to said control counter for receiving a strobe signal.

In a further preferred embodiment of the xDSL-Line-Interface-Circuit according to the present invention, the trimming circuit comprises a capacitance counter which is incremented by said first digital comparator when the count value of said switching frequency counter is smaller than the first set count value.

In a preferred embodiment of the xDSL-Line-Interface-Circuit according to the present invention, the trimming circuit comprises a status counter which is incremented by said first digital comparator when the count value of the switching frequency counter is higher or equal to the first set count value.

In a preferred embodiment of the xDSL-Line-Interface-Circuit according to the present invention, the trimming circuit comprises a second digital comparator which compares the count value of the status counter with a fixed second set count value.

In a preferred embodiment of the xDSL-Line-Interface-Circuit according to the present invention, the second digital comparator indicates the completion of the trimming when the count value of the status counter reaches the fixed second set count value.

In a preferred embodiment of the xDSL-Line-Interface-Circuit according to the present invention, the capacitance counter is connected via the control lines to the at least one capacitor of said loop low-pass filter.

In a preferred embodiment of the xDSL-Line-Interface-Circuit according to the present invention, the capacitance of said loop low-pass filter is decreased when the capacitance counter is incremented for increasing the switching frequency of said loop signal.

In a preferred embodiment of the xDSL-Line-Interface-Circuit according to the present invention, the reference clock signal is a system clock signal.

In a preferred embodiment, the xDSL-Line-Interface-Circuit receives a differential input signal.

In a preferred embodiment of the xDSL-Line-Interface-Circuit according to the present invention, the differential input signal is applied to an analog comparator for generating a reference clock signal which is applied to the trimming circuit.

In a preferred embodiment of the xDSL-Line-Interface-Circuit according to the present invention, the analog comparator and the trimming circuit are activated by a time-enable signal.

In a preferred embodiment of the xDSL-Line-Interface-Circuit according to the present invention, the xDSL-Line-Interface-Circuit comprises a demodulation filter connected to said self-oscillating loop circuit.

In a preferred embodiment of the xDSL-Line-Interface-Circuit according to the present invention, the xDSL-Line-Interface-Circuit comprises an echo cancellation circuit.

In a preferred embodiment of the xDSL-Line-Interface-Circuit according to the present invention, the demodulation filter is fed back to the input of the oscillating core and applied to an analog adaption circuit for adapting the output impedance of said xDSL-Line-Interface-Circuit to a subscriber line.

BRIEF DESCRIPTION OF THE DRAWINGS

The following preferred embodiments of the xDSL-Line-Interface-Circuit according to the present invention are described in detail with reference to the enclosed figures.

DETAILED DESCRIPTION

Figure 3:
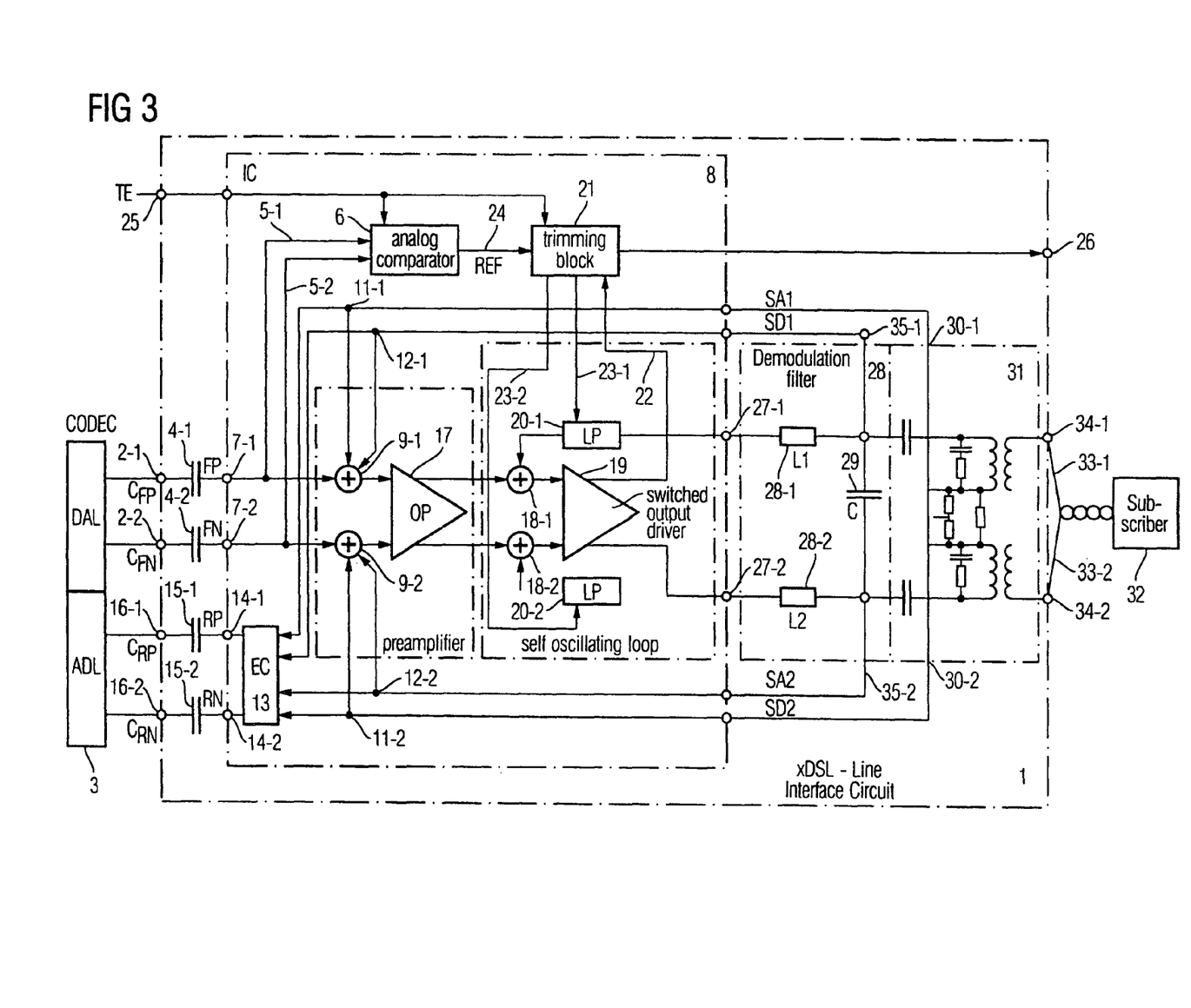
FIG. 3 shows an embodiment of the xDSL-Line-Interface-Circuit according to the present invention.

FIG. 3 shows a preferred embodiment of the xDSL-Line-Interface-Circuit 1 according to the present invention. The xDSL-Line-Interface-Circuit 1 as shown in FIG. 1 can be used preferably at a central office or as DSLAM, DLC and MSAP applications. The ADSL-line-interface-circuit 1 according to the present invention has a differential input terminal 2-1, 2-2 for receiving a differential analog input signal from a digital-analog converter DAC within a CODEC circuit 3. The differential input signal is applied via AC coupling capacitors 4-1, 4-2 and signal lines 5-1, 5-2 to an analog signal comparator 6. The differential analog input signal is applied to input terminals 7-1, 7-2 of an integrated circuit 8. The first differential input signal applied to the input terminal 7-1 is applied to an adder 9-1 which is connected to feedback nodes 11-1, 12-1. In the same manner, the second differential input signal applied to terminal 7-2 is supplied to adder 9-2 which is connected to second feedback nodes 11-2, 12-2. The feedback nodes 11-1, 11-2, 12-1, 12-2 are further connected to an echo cancellation circuit 13 of the integrated circuit 8. The echo cancellation circuit 13 is connected to output terminals 14-1, 14-2 of the integrated circuit 8. In an ADSL system, the key performance parameter of the central office side is the signal-to-noise ratio (SNR) in the received frequency band. The echo cancellation circuit 13 is provided to maximize the signal-to-noise ratio and removes about 20 dB of the transmitted signal from the received signal path. Not only the transmitted fundamental tones are echo-cancelled, but also the noise and distortion of the whole driver circuit are cancelled in the received signal path.

The output terminals 14-1, 14-2 are connected via AC coupling capacitors 15-1, 15-2 to output terminals 16-1, 16-2 of the ADSL-line-interface-circuit 1 according to the present invention. The differential output terminal 16-1, 16-2 of the ADSL-line-interface-circuit 1 is connected to an analog-digital converter (ADC) within the CODEC 3.

The adders 9-1, 9-2 are connected to the input of a differential operational amplifiers 17 which is provided for signal amplification. The output of the differential operation amplifier 17 is connected to the switched self-oscillating loop having, adders 18-1, 18-2 which are provided at the input side of a differential switched output driver 19. The input of the differential switched output driver contains a comparator that converts the differential input signal to a digital output signal. The drive 19 is a class-D amplifier which is switched with a switching frequency. The output of the driver 19 is fed back via loop filters 20-1, 20-2 through the adders 18-1, 18-2. The loop filters 20-1, 20-2 feed back the amplified loop signal output by the switched output driver 19 to the input terminals of said driver 19. The adders 18-1, 18-2 the driver 19 and the loop filters 20-1, 20-2 form a self oscillating differential loop signal loop wherein a loop signal oscillates with a switching frequency $f_{s1}$. The loop filters 20-1, 20-2 are analog low-pass filters. In a preferred embodiment, the analog low pass filters are formed by RC-analog filters wherein the capacitance of the capacitors provided within the RC-analog low-pass filters is adjustable.

The xDSL-Line-Interface-Circuit 1 according to the present invention comprises a trimming circuit 21 for trimming the switching frequency $f_s$ of the oscillating loop signals applied to the class-D output driver 19. The trimming circuit 21 is connected to the output of the class-D amplifier 19 via a line 22 to receive a loop signal oscillating with a switching frequency $f_s$. The trimming circuit 21 is further connected to the low-pass filters 20-1, 20-2 via control lines 23-1, 23-2. By means of the control lines 23-1, 23-2, the trimming circuit 21 is able to adjust the capacitance of the RC-analog low-pass filters 20-1, 20-2.

In the preferred embodiment as shown in FIG. 3, the trimming circuit 21 is connected to the output of the analog signal comparator 6 to receive the reference clock signal via line 24. In an alternative embodiment, the reference clock signal is a system clock signal.

The trimming circuit 21 and the analog comparator 6 are activated by a trim-enable signal TE which is applied to a control terminal 25 of the xDSL-Line-Interface-Circuit 1 according to the present invention. In a possible embodiment when the trimming of the oscillating loop is accomplished, this is indicated by the trimming circuit 21 via a trimming-o.k. signal which is output via the terminal 26 of the xDSL-Line-Interface-Circuit 1

In a preferred embodiment, the trimming circuit 21 performs the trimming of the switching frequencies of the oscillating loops during the training sequence of the xDSL-Line-Interface-Circuit 1.

The class-D driver 19 is connected at the output side to output terminals 27-1, 27-2 of the integrated circuit 8. The output terminals 27-1, 27-2 are connected to a demodulation filter 28. The demodulation filter 28 is a low-pass filter which is provided for removing switching residuals from the output signal spectrum. The demodulation filter 28 as shown in FIG. 3 comprises a first inductance 28-1 and a second inductance 28-2 as well as a capacitor 29. On the output side the demodulation filter 28 is connected via first feedback lines 30-1, 30-2 to nodes 11-1, 11-2.

The xDSL-Line-Interface-Circuit 1 according to the present invention further includes a signal adaption circuit 31 for adapting the output impedance Z of the xDSL-Line-Interface-Circuit 1 to the subscriber line 32 which is connected with a pair of telephone lines 33-1, 33-2 to a differential signal output 34-1, 34-2 of the xDSL-Line-Interface-Circuit 1. Second signal feedback lines 35-1, 35-2 connect the terminals 12-1, 12-2 with the analog adaption circuit 31. The analog feedback is supplied to the inputs in order to define the signal gain of the amplifier and to adapt the termination impedance to the output. At the input of amplifiers 17, the differential input signal of the xDSL-Line-Interface-Circuit 1 is superimposed on the feedback signals.

As can be seen from FIG. 3, the xDSL-Line-Interface-Circuit 1 according to the present invention is an analog signal driver having analog input signals and analog output signals wherein the analog driver is built around a switched core. The switching frequency $f_s$ of the switched core is dependent on the stability properties of the internal switched loop formed by the adder 18, the class-D driver 19 and the analog low-pass filter 20.

The power consumption of the xDSL-Line-Interface increases with the increasing switching frequency $f_s$ of the oscillating loop signals. The trimming circuit 21 of the xDSL-Line-Interface-Circuit is provided for keeping the switching frequencies $f_s$ within determined limits. With the trimming circuit 21, it is possible to fulfill certain standard requirements and to achieve cost-effective volume production. Such requirements are e.g. the SFDR spurious free dynamic range and the MTPR (multitone power ratio).

Figure 4A:
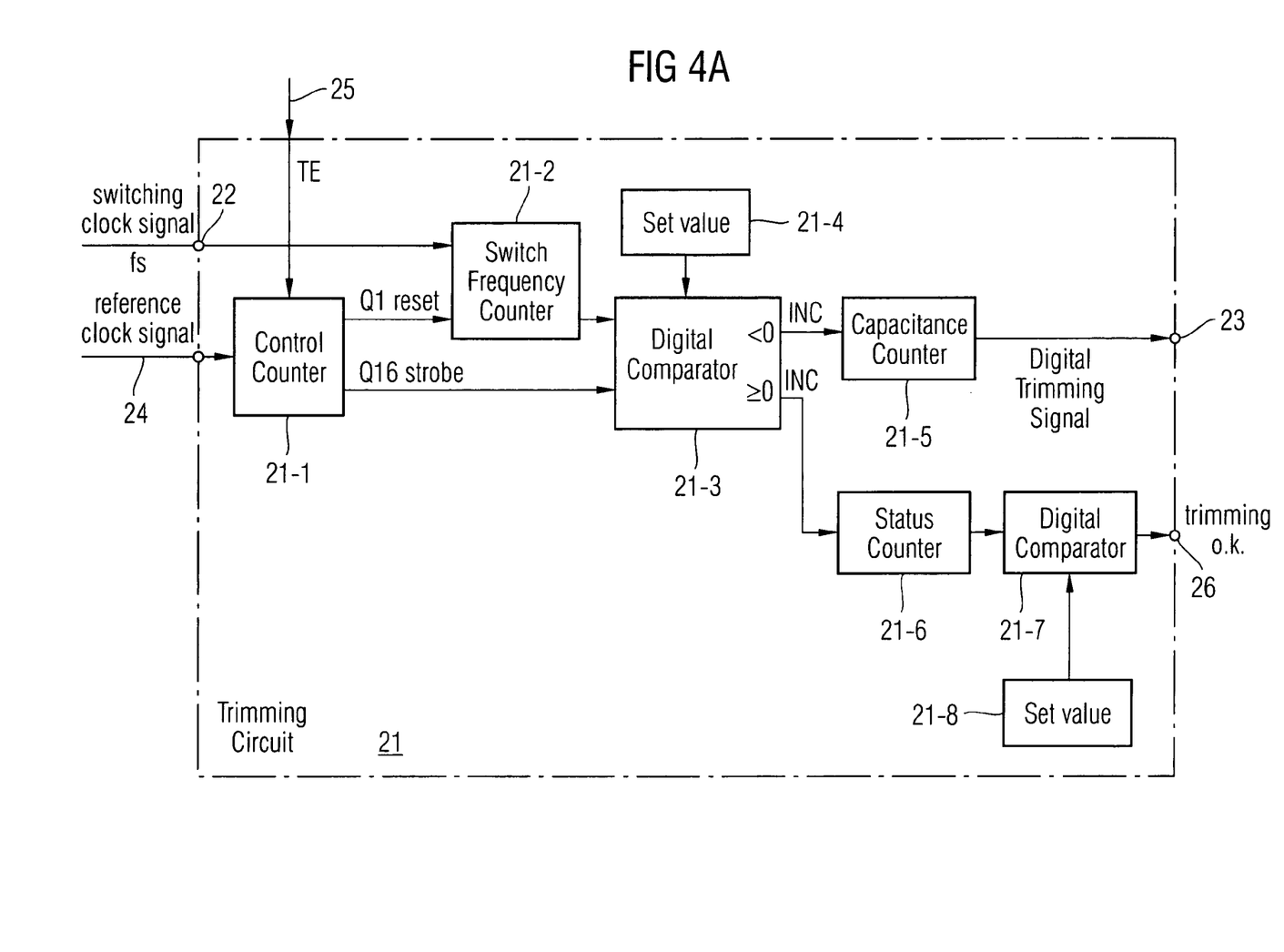
FIG. 4A, 4B shows a block diagram of alternative embodiments of trimming circuits according to the present invention.

FIG. 4A shows a first embodiment of the trimming circuit 21 according to the present invention in more detail. The trimming circuit 21 comprises a control counter 21-1, a switched frequency counter 21-2 and a digital comparator 21-3. The control counter 21-1 counts the signal pulses of a reference clock signal applied via line 24 to the trimming circuit 21. In the preferred embodiment shown in FIG. 3, the reference clock signal is the output signal of the analog comparator 6 which compares different analog input signals applied to the terminals 2-1, 2-2 of the xDSL-Line-Interface-Circuit 1. In an alternative embodiment, the reference clock signal is a system clock signal. The switching frequency $f_s$ of the self-oscillating loop is measured at a fixed clock interval wherein the clock interval is determined by the use of the reference clock signal.

After a power-up, the trimming is enabled through the trim-enable signal TE enabling the trimming circuit 21. The control counter 21-1 counts in a preferred embodiment 16 pulses wherein after the first pulse of the reference clock signal the switching frequency counter 21-2 is reset. The number of pulses of the self-oscillating loop is counted by the switching frequency counter 21-2 during the clock interval of the reference clock signal. The output of the switching frequency counter 21-2 is connected to a first input of the digital comparator 21-3. The digital comparator 21-3 compares the count value of the switching frequency counter 21-2 with a fixed first set count value stored in a memory 21-4 of the trimming circuit 21. When the count value of the switching frequency counter 21-2 is smaller than the first set count value, i.e. when the difference is lower than zero, the capacitance counter 21-5 of the trimming circuit 21 is incremented by the digital comparator 21-3. The capacitance counter 21-5 applies a digital trimming signal to capacitors of the low-pass filters 20-1, 20-2 to adjust the capacitance of said capacitors. With the increasing count value of the capacitance counter 21-5, the capacitance of the RC low-pass filters 20-1, 20-2 is decreased to increase the switching frequency $f_s$ of the oscillating loops.

When the number of pulses of the self-oscillating loop signal counted during the predetermined clock interval of the reference clock signal is higher or equal to the set count value stored in memory 21-4, it is decided by the comparator 21-3 that the desired set frequency $f_{s\text{-}set}$ has been reached and a status counter 21-6 of the trimming circuit 21 is incremented. To make sure that the decision is correct, the second digital comparator 21-7 of the trimming circuit 21 is provided and compares the count value of the status counter 21-6 with a second set count value memorized in a memory 21-8 of the trimming circuit. If the count value of the status counter 21-6 has reached the second set value, e.g. the set value of 8, it is decided by the digital comparator 21-7 that trimming has been accomplished of the ADSL-line-interface-circuit 1.

Figure 4B:
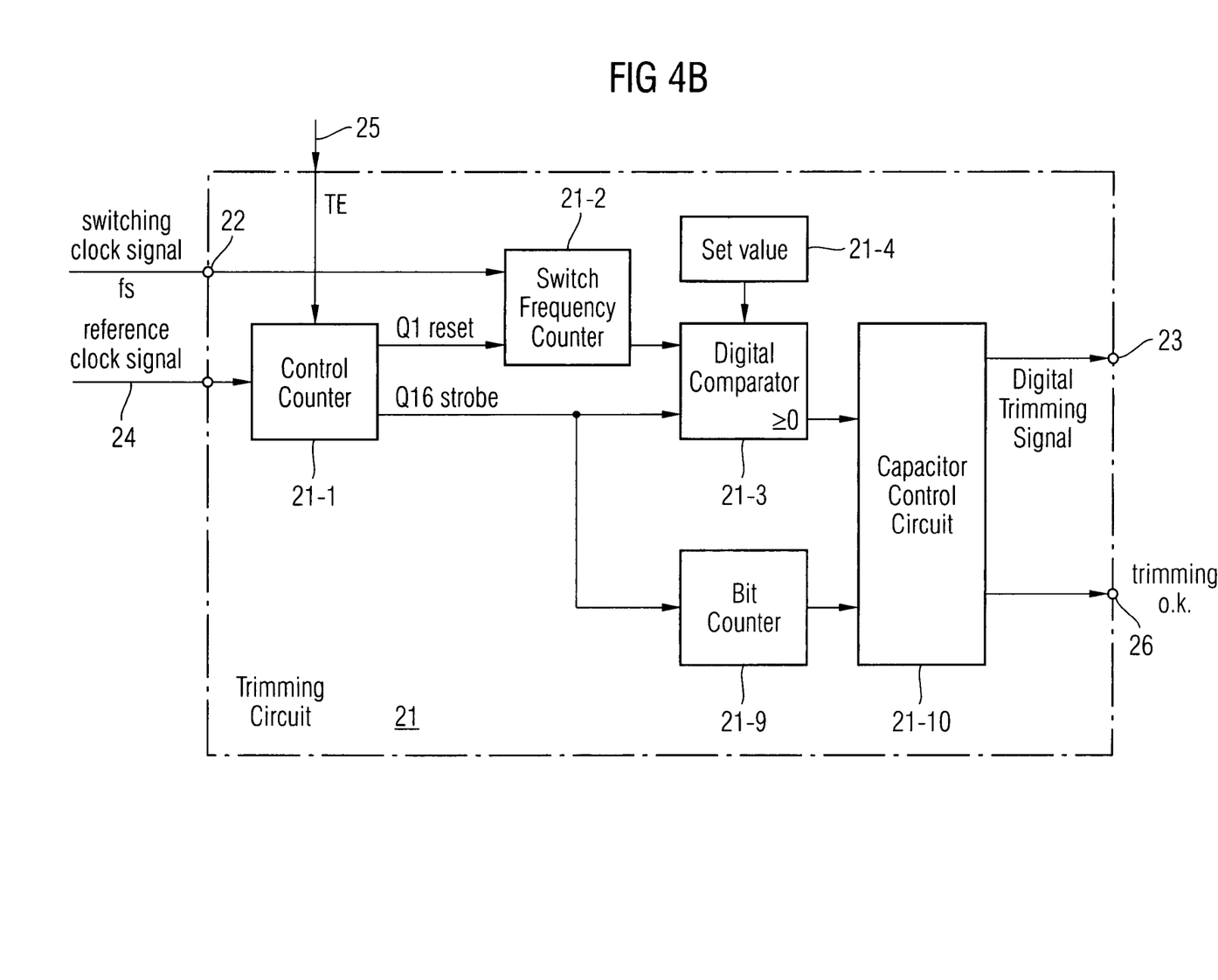

FIG. 4B shows a second preferred embodiment of the trimming circuit 21 for the trimming the switching frequency of the self-oscillating loop circuit within the xDSL-Line-Interface-Circuit 1 according to the present invention. Like in the first embodiment after a power up the trimming is enabled through trimming enable signal Te enabling the trimming circuit 21. A bit-counter 21-9 counts down from bit 3 to bit 0 wherein each bit corresponds to one of the bits controlling the binary weighted capacitor units in the low pass feedback. For each bit the following procedure is performed. A corresponding bit (3 for MSB to 0 for LSB) of the capacitance control circuit 21-10 is set high while all the lower significant bits are set low. The control counter 21-1 counts 8 pulses in a preferred embodiment where the reference clock signal is the output-signal of the analog comparator 6. In an alternative embodiment at the reference clock signal on line 24 is a system clock signal the control counter 21-1 counts 119 pulses. After the first pulse of the reference clock signal the switching frequency counter 21-2 of the trimming circuit 22 as shown in FIG. 4B is reset. The number of pulses of the self-oscillating loop is counted by the switching frequency counter 21-2 during the clock interval of the reference clock signal. The output of the switching frequency counter 21-2 is connected to a first input of the digital comparator 21-3. The digital comparator 21-3 compares the count value of the switching frequency counter 21-2 with a fixed first account value stored in a memory 21-4 of the trimming circuit 21 as shown in FIG. 4B. If the count value of the switching frequency counter 21-2 is higher than the fixed set value the corresponding bit in the capacitor control circuit 21-10 is kept high. If the count value of the switching frequency counter 21-2 is lower than the fixed set value the corresponding bit in the capacitor control circuit 21-10 is set low.

Figure 5:
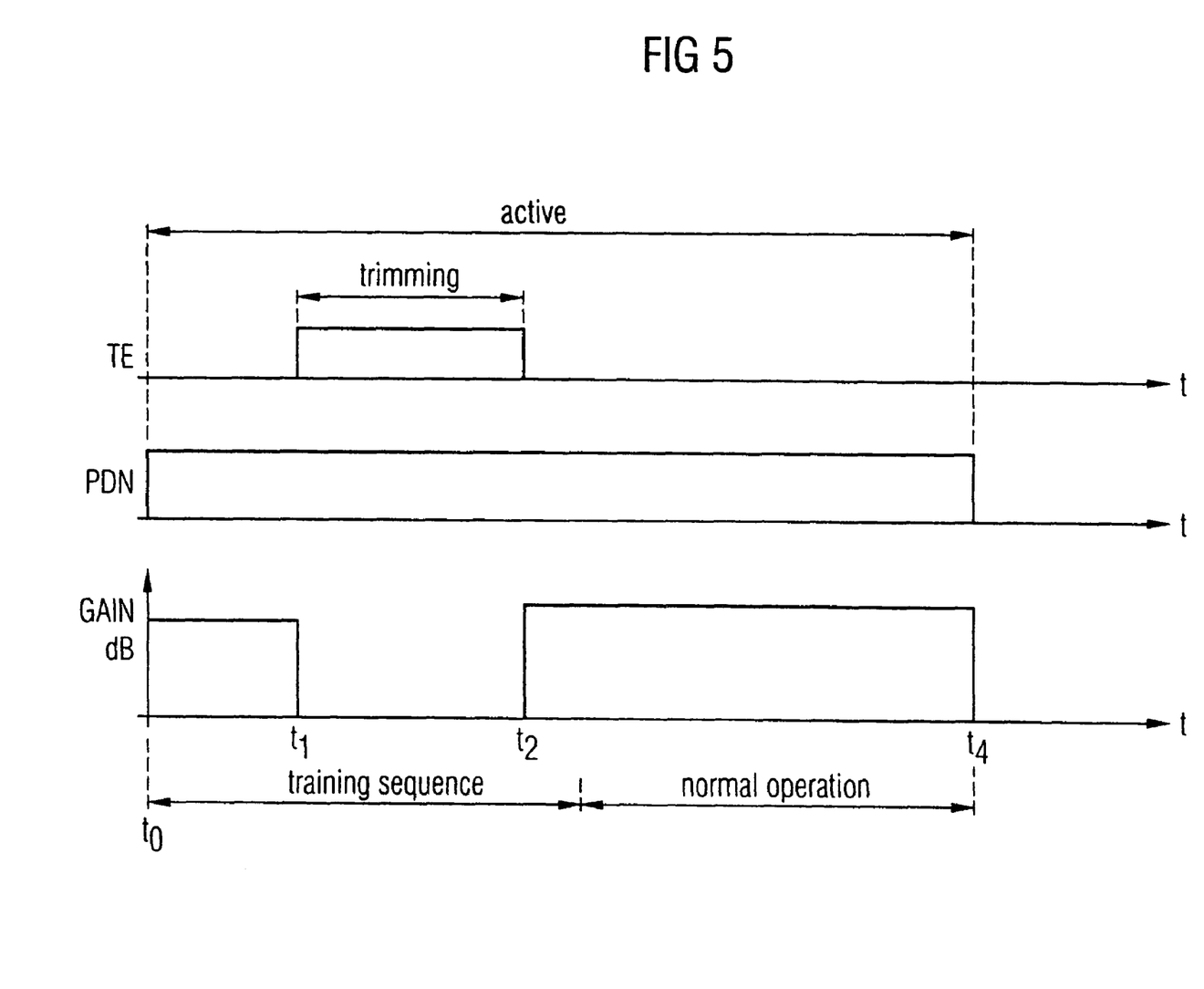
FIG. 5 shows a signal timing diagram for explaining the functionality of the trimming circuit of FIG. 4 according to the present invention.

FIG. 5 shows the timing of the trimming performed by the trimming circuit 21.

At $t_0$, the xDSL-Line-Interface-Circuit 1 is activated when a power-down PDN control signal goes high. When the xDSL-Line-interface-Circuit 1 performs a training sequence, the trim-enable signal TE can go high. In a preferred embodiment, the trimming can be started about 1 ms after the PDN input is high. In a preferred embodiment, the default value of the switched frequency is set to 10 MHz. During the trimming interval between t1, t2, the trimming is performed by sending a reference signal from the CODEC 3 to the input terminals 2-1, 2-2 of the xDSL-Line-Interface-Circuit 1. In preferred embodiments, the reference clock signal is a sinus 30 $mV_{rms} \pm 5\ mV_{rms}$ at a frequency of 1.104 MHz or 552 KHz. The trimming lasts, in a preferred embodiment, approximately 1 ms. The counters which control the capacitance of the low-pass filters 20-1, 20-2 in the switched loop keep their counting values as long as the PDN input is high (IceDrive active).

The preferred embodiments of the capacitance of the RC-analog low-pass filters in the self-oscillating loops consist of binary weighted capacitor units which are controlled by a four-bit control line 23.

The capacitance counter 21-5 steps down the capacitor value of the low-pass filter 20 as long as the self-oscillating frequency $f_s$ is lower than the tuning frequency.

Figure 6:
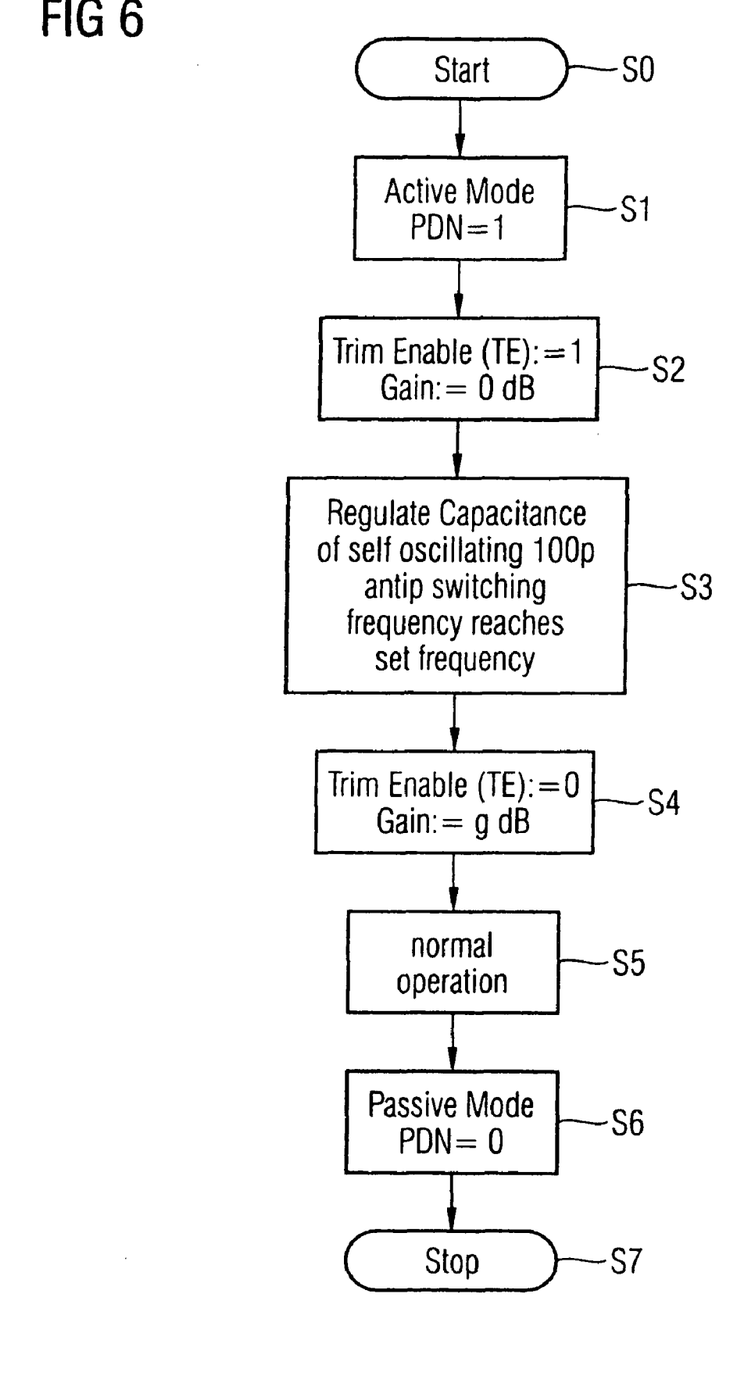
FIG. 6 shows a flowchart of the trimming procedure according to the present invention.

FIG. 6 shows a flowchart of the trimming procedures according to the present invention.

After the start at step $S_0$, the xDSL-Line-Interface-Circuit 1 is activated by setting the power-down control signal PDN to high at step S1. Trimming is enabled at step S2 by setting a trim-enable control signal.

In step S3, the capacitance of the self-oscillating loop is regulated until the switching frequency $f_s$ reaches a set switching frequency $f_{s\text{-}set}$.

In a step S4, the trim-enable signal is reset. In step S5, die xDSL-Line-Interface-Circuit 1 is operated in a normal operation mode. By setting the PDN control signal, the xDSL-Line-Interface-Circuit 1 is deactivated in step S6, and the procedure stops in step S7.

The trimming circuit 21 performs the trimming of low-pass filter 20-1 and 20-2 at the same time.

The trimming circuit 21 starts the trimming of the capacitance of the low-pass filters 20-1, 20-2 with a low switching frequency $f_s$ and increments the switching frequency $f_s$ by decreasing the capacitance of the RC low-pass filters 20-1, 20-2. The switching frequency $f_s$ is increased until a desired set switching frequency $f_s$ value is reached. The trimming circuit 21 makes sure that a switching frequency $f_s$ within the loop circuits goes to a certain interval of the the desired switching frequency so that the current consumption of the xDSL-Line-Interface-Circuit 1 goes to a certain interval of the desired current consumption since it is proportional to the switching frequency $f_s$ of the loop circuits.

In the preferred embodiment shown in FIG. 3, one of the tones of the DMT-signal spectrum is used as a reference signal and applied to the analog comparator 6. The trimming circuit 21 performs the trimming during the training sequence of the xDSL-Line-Interface-Circuit 1 wherein a single tone of the DMT-transmit signal spectrum is used as a reference frequency. According to the preferred embodiment shown in FIG. 3, no system reference clock signal is necessary. The trimming is only performed when a trim-enable signal is high. If no trimming is performed after the power supply is on, the switching frequency is set to a default value, e.g. 10.5 MHz±1.5 MHz.

The trimming of the analog low-pass RC filters allows a higher variation of the manufacturing process and a higher variation of the temperature T. Consequently, the xDSL-Line-Interface-Circuit 1 according to the present invention is more robust against process deviations and temperature changes.

The trimming by the trimming circuit 21 can be performed at any time to compensate changes of the environmental conditions such as temperature changes which might affect the switching frequency of the oscillating loop circuits.

REFERENCE LIST 1 xDSL-Line-Interface-Circuit
2 differential input
3 CODEC circuit
4 coupling capacitors
5 lines
6 analog comparator
7 input terminals
8 integrated circuit
9 adders
10 -
11 feedback input terminal
12 feedback input terminal
13 echo cancellation unit
14 output terminals
15 output coupling capacitors
16 differential output
17 operational amplifier
18 adders
19 class-d driver
20 low-pass filters
21 trimming circuit
22 switching frequency measuring line
23 trimming control lines
24 reference signal line
25 trim-enable input
26 trimming-o.k. output
27 output terminals
28 demodulation filter
29 capacitor
30 feedback lines
31 analog adapting circuit
32 subscriber line
33 twisted pair telephone lines
34 xDSL-line-interface-circuit output terminal
35 feedback lines

The invention claimed is:

1. An xDSL line interface circuit having:
   a) at least one self oscillating loop circuit which oscillates with a switching frequency ($f_s$), wherein the self oscillating loop circuit comprises
      a1) an output driver configured to be switched with said switching frequency, and
      a2) an analog low pass RC filter configured to feed back an amplified loop signal output of said output driver to an input of said self oscillating loop; and
   b) a trimming circuit configured to trim the switching frequency (fs) of said self oscillating loop circuit by adjusting a capacitance of at least one capacitor of said analog low pass RC filter.

2. The xDSL line interface circuit according to claim 1, wherein the output driver comprises a class-D-amplifier.

3. The xDSL line interface circuit according to claim 1, wherein said trimming circuit is connected via a line to said self oscillating loop circuit for receiving a loop signal oscillating at said switching frequency (fs).

4. The xDSL line interface circuit according to claim 1, wherein said xDSL line interface circuit comprises an ADSL line interface circuit.

5. The xDSL line interface circuit according to claim 1, wherein the trimming circuit is configured to trim the switching frequency during a training sequence operation of said xDSL line interface circuit.

6. The xDSL line interface circuit according to claim 1, wherein the trimming circuit comprises a control counter configured to count pulses of a reference clock signal.

7. The xDSL line interface circuit according to claim 6, wherein said trimming circuit further comprises a switch frequency counter configured to count pulses of a loop signal of the self oscillating loop circuit to generate a count value.

8. The xDSL line interface circuit according to claim 7, wherein said trimming circuit further comprises a first digital comparator configured to compare the count value of said switch frequency counter with a fixed first set count value.

9. The xDSL line interface circuit according to claim 7, wherein said switch frequency counter is operably connected to receive a reset signal from said control counter.

10. The xDSL line interface circuit according to claim 8, wherein the first digital comparator is operably connected to receive a strobe signal from said control counter.

11. The xDSL line interface circuit according to claim 10, wherein the trimming circuit comprises a capacitance counter configured to be incremented by said first digital comparator when the count value of said switching frequency counter is smaller than the first set count value.

12. The xDSL line interface circuit according to claim 11, wherein the trimming circuit comprises a status counter having a value configured to be incremented by said first digital comparator when the count value of said switch frequency counter is higher than or equal to the first set count value.

13. The xDSL line interface circuit according to claim 12, wherein the trimming circuit comprises a second digital comparator which compares the incremented value of said status counter with a fixed second set count value.

14. The xDSL line interface circuit according to claim 13, wherein said second digital comparator indicates a completion of the trimming when the incremented value of said status counter reaches the fixed second set count value.

15. The xDSL line interface circuit according to claim 11, wherein said loop filter comprises a low pass filter having at least one adjustable capacitor, and wherein the capacitance counter is operably connected to the at least one adjustable capacitor.

16. The xDSL line interface circuit according to claim 15, wherein the capacitance of said low pass filter is decreased when the capacitance counter is incremented.

17. The xDSL line interface circuit according to claim 6, wherein the reference clock signal is a system clock signal.

18. The xDSL line interface circuit according to claim 1, wherein the xDSL line interface circuit is configured to receive a differential input signal.

19. The xDSL line interface circuit according to claim 18, further comprising an analog comparator configured to receive the differential input signal, the analog comparator configured to generate the reference clock signal based on the differential input signal.

20. The xDSL line interface circuit according to claim 19, wherein said analog comparator and said trimming circuit are configured to be activated by a trimming enable signal.

21. The xDSL line interface circuit according to claim 1, further comprising a demodulation filter connected to said self oscillating loop circuit.

22. The xDSL line interface circuit according to claim 1, further comprising an echo cancellation circuit.

23. The xDSL line interface circuit according to claim 21, wherein the demodulation filter comprises an output fed back to the input of the self oscillating loop circuit and applied to an analog adaption circuit, the analog adaption circuit configured to adapt the output impedance of said xDSL line interface circuit to a subscriber line.

* * * * *